United States Patent
Bhavnagarwala et al.

(10) Patent No.: US 6,920,061 B2
(45) Date of Patent: Jul. 19, 2005

(54) LOADLESS NMOS FOUR TRANSISTOR DYNAMIC DUAL VT SRAM CELL

(75) Inventors: Azeez Bhavnagarwala, Newton, CT (US); Rajiv V. Joshi, Yorktown Heights, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 10/649,200

(22) Filed: Aug. 27, 2003

(65) Prior Publication Data

US 2005/0047196 A1 Mar. 3, 2005

(51) Int. Cl.$^7$ .............................................. G11C 11/00
(52) U.S. Cl. .................. 365/154; 365/156; 365/189.05; 365/185.24
(58) Field of Search ................................ 365/154, 156, 365/189.05, 185.24

(56) References Cited

U.S. PATENT DOCUMENTS

| | | | | |
|---|---|---|---|---|
| 4,821,235 A | * | 4/1989 | Heald | 365/177 |
| 5,583,821 A | * | 12/1996 | Rose et al. | 365/156 |
| 5,665,629 A | | 9/1997 | Chen et al. | 438/384 |
| 5,780,331 A | | 7/1998 | Liaw et al. | 438/238 |
| 5,886,921 A | | 3/1999 | Davies et al. | 365/154 |
| 6,172,899 B1 | | 1/2001 | Marr et al. | 365/154 |
| 6,181,608 B1 | | 1/2001 | Keshavarzi et al. | 365/188 |
| 6,198,670 B1 | | 3/2001 | Marr | 365/189.09 |
| 6,366,493 B1 | | 4/2002 | Hsiao et al. | 365/156 |
| 6,434,040 B1 | | 8/2002 | Kim et al. | 365/154 |
| 6,483,739 B2 | | 11/2002 | Houston | 365/154 |
| 6,514,823 B2 | | 2/2003 | Hashimoto | 438/275 |

FOREIGN PATENT DOCUMENTS

| | | |
|---|---|---|
| JP | 8-171799 | 7/1996 |
| JP | 8-321178 | 12/1996 |

\* cited by examiner

*Primary Examiner*—Connie C. Yoha
(74) *Attorney, Agent, or Firm*—Frank V. DeRosa (57) ABSTRACT

Loadless 4T SRAM cells, and methods for operating such SRAM cells, which can provide highly integrated semiconductor memory devices while providing increased performance with respect to data stability and increased I/O speed for data access operations. A loadless 4T SRAM cell comprises a pair of access transistors and a pair of pull-down transistors, all of which are implemented as N-channel transistors (NFETs or NMOSFETS). The access transistors have lower threshold voltages than the pull-down transistors, which enables the SRAM cell to effectively maintain a logic "1" potential during standby. The pull-down transistors have larger channel widths as compared to the access transistors, which enables the SRAM cell to effectively maintain a logic "0" potential at a given storage node during a read operation. A method is implemented for dynamically adjusting the threshold voltages of the transistors of activated memory cells during an access operation to thereby increase the read current or performance of the accessed memory cells.

31 Claims, 4 Drawing Sheets

$$V_{dd}\gamma = V_{dd}\,C_C/(C_C+C_M)$$

LOADLESS NMOS FOUR TRANSISTOR DYNAMIC DUAL VT SRAM CELL

TECHNICAL FIELD OF THE INVENTION

The present invention relates generally to semiconductor memory devices. More specifically, the invention relates to loadless, four transistor (4T) SRAM (static random access memory) cell architecture comprising four NMOSFETs (N-channel metal oxide semiconductor field effect transistors) or NFETs, and a method for accessing such SRAM cells.

BACKGROUND

There is a continuing demand for semiconductor memory devices with higher density and low power consumption. Semiconductor memory devices include, for example, SRAM and DRAM (dynamic random access memory) devices. Although DRAM provides a high degree of integration, SRAM is typically preferred over DRAM because SRAM cells can operate at higher speeds and lower power dissipation than DRAM cells. Indeed, SRAM cells typically do not require refreshing and can store data indefinitely as long as such cells are powered. In contrast, DRAM cells must be periodically refreshed.

One well-known conventional structure of an SRAM cell is a 6T (six transistor) cell that comprises six MOS (or FET) transistors. Briefly, a 6T SRAM cell comprises two cross-coupled inverters that form a latch circuit. The latch is connected between power and ground and is connected to a pair of access transistors. Each inverter comprises two transistors (typically an NMOS pull-down transistor and pull-up PMOS transistor). The latch, which is formed by the first and second cross-coupled inverters, is connected between two storage nodes, wherein one of the storage nodes is pulled low and the other storage node is pulled high. Each storage node is connected to a bit line or complementary bit line of a bit line pair via an access transistor. The gate terminals of the access transistors are commonly connected to a wordline. When the access transistors are deactivated, the storage nodes are essentially insulated from the bit lines, although some leakage can occur.

Although 6T SRAM cells can provide high speed operation and can operate with low power supply voltage, 6T cells occupy a large area, thus limiting the memory cell density. Accordingly, to provide higher density SRAM memory, 4T SRAM cell architectures such as loadless 4T SRAM cells, have been proposed, which occupy significantly less space than 6T SRAM cells.

Figure 1:
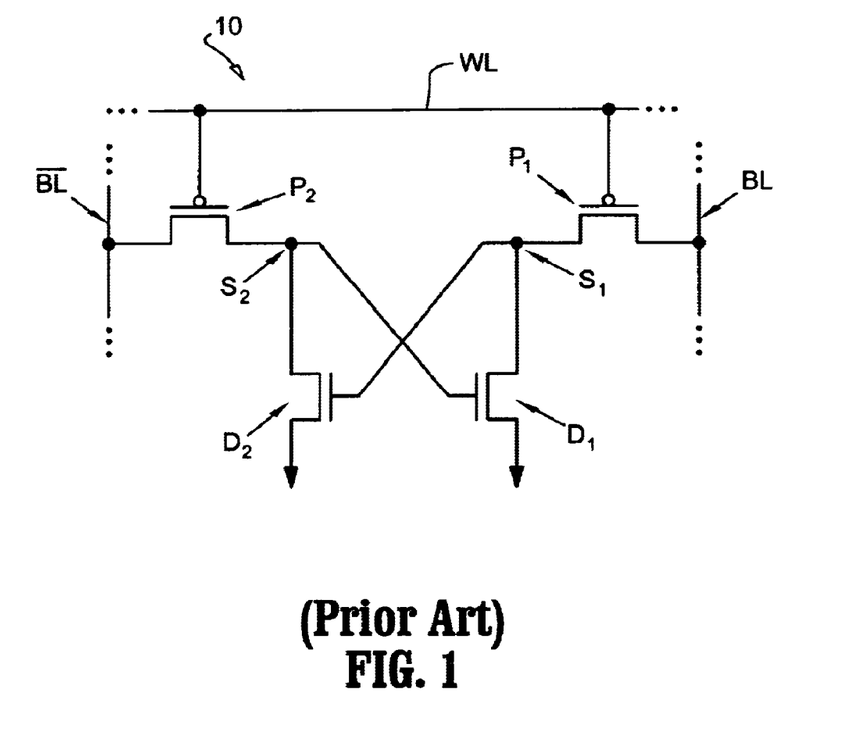
FIG. 1 is a schematic diagram illustrating a conventional loadless four-transistor SRAM memory cell.

For example, FIG. 1 illustrates a conventional loadless 4T SRAM cell. In general, the loadless 4T cell (10) comprises a CMOS memory cell that uses four transistors, wherein no load elements are connected to storage nodes of the cell. More specifically, as depicted in FIG. 1, the loadless 4T SRAM cell (10) comprises four-transistors including two access transistors (P1) and (P2) (or pass transistors) and two pull-down transistors (D1) and (D2) or (drive transistors). The access transistors (P1) and (P2) are PMOS transistors and the pull-down transistors (D1) and (D2) are NMOS transistors. A wordline (WL) is commonly coupled to the gates of the access transistors (P1) and (P2). A bit line pair connected to the memory cell (10) comprises a complimentary bit line (/BL) and a bit line (BL). The bitline (BL) is connected to the source of access transistor (P1) and the complementary bit line (/BL) is connected to the source of access transistor (P2). The drain of access transistor (P1) is connected to storage node (S1) and to the gate of pull-down transistor (D2). The drain of access transistor (P2) is connected to storage node (S2) and to the gate of pull-down transistor (D1). The drain of access transistor (P1) is connected to the source of pull-down transistor (D1) and the drain of pull-down transistor (D1) is connected to ground (or Vss). Similarly, the drain of access transistor (P2) is connected to the source of pull-down transistor (D2) and the drain of pull-down transistor (D2) is connected to ground (or Vss).

When the storage node (S1) is at logic "1" and the storage node (S2) is at logic "0", the cell (10) can be considered as storing a logic "1". In contrast, when the storage node (S1) is at logic "0" and the storage node (S2) is at logic "1", the cell (10) can be considered as storing a logic "0". Thus the cell (10) is bistable, i.e., the cell (10) can have one of two stable states, logic "1" or logic "0".

In contrast to conventional 6T SRAM cells with pull-up transistors or 4T SRAM cells with resistive loads, a loadless SRAM (as shown in FIG. 1) does not have loads that are connected between the storage nodes (S1) and (S2) and power supply (e.g., Vdd), which provides the current needed to maintain the state of the latch. Instead, the data state of the loadless 4T cell (10) is maintained by leakage current provided by the access transistors (P1) and (P2). For this purpose, the conventional loadless 4T SRAM cell (10) uses PMOS access transistors (P1) and (P2) to supply the leakage current needed to maintain the data state of the latch circuit during "standby" (i.e., when the cell is not accessed).

More specifically, the loadless 4T SRAM memory cell (10) operates as follows during standby. Assume that storage node (S1) is at a voltage potential of logic "1" and that storage node (S2) is at a voltage potential of logic "0". In this instance, the pull-down transistor (D1) and access transistor (P1) are turned "off" because the gate of pull-down transistor (D1) is logic "0" and the WL (connected to the gate of access transistor (P1) is not activated. In this state, without the leakage current through the access transistor (P1), the potential of storage node (S1) can gradually decrease due to a subthreshold leakage current through the pull-down transistor (D1). Although the loadless 4T memory cell (10) has no load element connected between a power supply and node (S1) for supplying current to the storage node (S1), the leakage current of the PMOS (or PFET) access transistor (P1) flows to the storage node (S1) to compensate for the depletion of charge from the storage node (S1).

To sufficiently maintain the data state (e.g., substantially maintain a logic "1" at node (S1) in the above example), the leakage current that flows from the access transistor (P1) into the storage node (S1) should be greater than the leakage current through the pull-down transistor (D1) which connects node (S1) to ground (or Vss). The conventional loadless SRAM cell (10) as shown in FIG. 1 utilizes PMOS (or PFET) access transistors (P1) and (P2) because such transistors are leakier than NMOS (or NFET) transistors and thus, provide the necessary leakage current to maintain a logic "1" that is stored at node S1 or S2. Another reason PMOS access transistors are used in the conventional architecture is that such transistors conduct a logic "1" very well, as compared to NMOS transistors where a logic "1" is decreased by the voltage threshold (Vt) of the access transistor. In other words, with PMOS access transistors, a logic "1" can be read from and written to the cell without a voltage drop of Vdd-Vt.

An advantage of the loadless 4t memory cell (10) is that it eliminates the need for providing load elements that are generally connected to the storage nodes of the pull-down transistors, thereby simplifying the structure of the memory cell. However, a disadvantage associated with the loadless SRAM cell (10) of FIG. 1 is that the PMOS or PFET access transistors (P1) and (P2) are relatively larger as compared to NMOS or NFET devices, which can limit the cell density. Furthermore, PFETs have slower switching speeds as compared to NFETs of the same geometry. Thus, the use of PFET access transistors in the loadless 4T cell (10) of FIG. 1 decreases the access speed of the cell. Indeed, the carrier mobility of a PFET is about one-half (½) of that of an NFET and therefore, to obtain the same switching performance as that of an NFET, the channel width of a PFET access device would have to be increased 2×.

Therefore, there is a need for an improved architecture for a loadless, 4T SRAM cell, and method of operating such SRAM cell, which would provide increased performance and density than that of conventional loadless 4t SRAM cells.

SUMMARY OF THE INVENTION

Exemplary embodiments of the present invention include architectures for loadless, 4T SRAM cells, and methods for operating such SRAM cells, which can provide highly integrated semiconductor memory devices while providing increased performance with respect to data stability and increased I/O speed for data access operations.

In general, in one embodiment of the invention, a loadless, 4T SRAM cell comprises a pair of access transistors and a pair of pull-down transistors, all of which are implemented as N-channel transistors (NFETs or NMOSFETS), which enables such cells to be used in high density applications. In another embodiment of the invention, the N-channel access transistors have lower threshold voltages (Vt) than the N-channel pull-down transistors, which enables the SRAM cell to effectively maintain a logic "1" potential during standby. In another embodiment, the N-type pull-down transistors have larger channel widths as compared to the N-type access transistors, which enables the SRAM cell to effectively maintain a logic "0" potential at a given storage node during a read operation. In another embodiment, a method is implemented for dynamically adjusting the threshold voltages of the transistors of activated memory cells during an access operation to thereby increase the read current of the accessed memory cells.

These and other embodiments, aspects, features, and advantages of the present invention will become apparent from the following detailed description of exemplary embodiments, which is to be read in connection with the accompanying drawings.

DETAILED DESCRIPTION OF EXEMPLARY EMBODIMENTS

Exemplary embodiments of the present invention comprise architectures for loadless 4T SRAM cells, and methods for operating such SRAM cells, which can provide highly integrated semiconductor memory devices while providing increased performance with respect to data stability and increased I/O speed for data access operations, for example.

In general, in one embodiment of the invention, a loadless, 4T SRAM cell comprises a pair of access transistors and a pair of pull-down transistors, all of which are implements as n-channel transistors (NFETs or NMOSFETS). A loadless 4T SRAM cell architecture according to the present invention in which all transistors are NFETs (or NMOSFETs), for example, provides about a 50% decrease in cell area as compared to conventional 6T SRAM cells, as well as a significant decrease in the cell area as compared to conventional loadless, 4T SRAM cells that use PFETs (or PMOSFETs) as access transistors.

In another embodiment of the invention, a loadless 4T SRAM cell architecture comprises two N-channel access transistors and two N-channel pull-down transistors, wherein the access transistors have lower threshold voltages (Vt) than the pull-down transistors. As explained below, the different Vts between the access transistors and pull-down transistors enables a SRAM cell to effectively maintain a logic "1" potential during standby and thus, maintain stability of the memory cell.

In yet another embodiment of the invention, the pull-down transistors are designed to have larger channel widths as compared to the access transistors, which enables the SRAM cell to effectively maintain a logic "0" potential at a given storage node during read operations and thus, maintain stability of the memory cell.

In another embodiment of the present invention, increased performance of an SRAM semiconductor memory device comprising an array of loadless, 4T SRAM cells according to an embodiment of the invention, is obtained by dynamically adjusting the threshold voltages of transistors of memory cells that are activated during an memory access operation to thereby increase the read current, $I_{Read}$, of the accessed memory cells.

Figure 2:
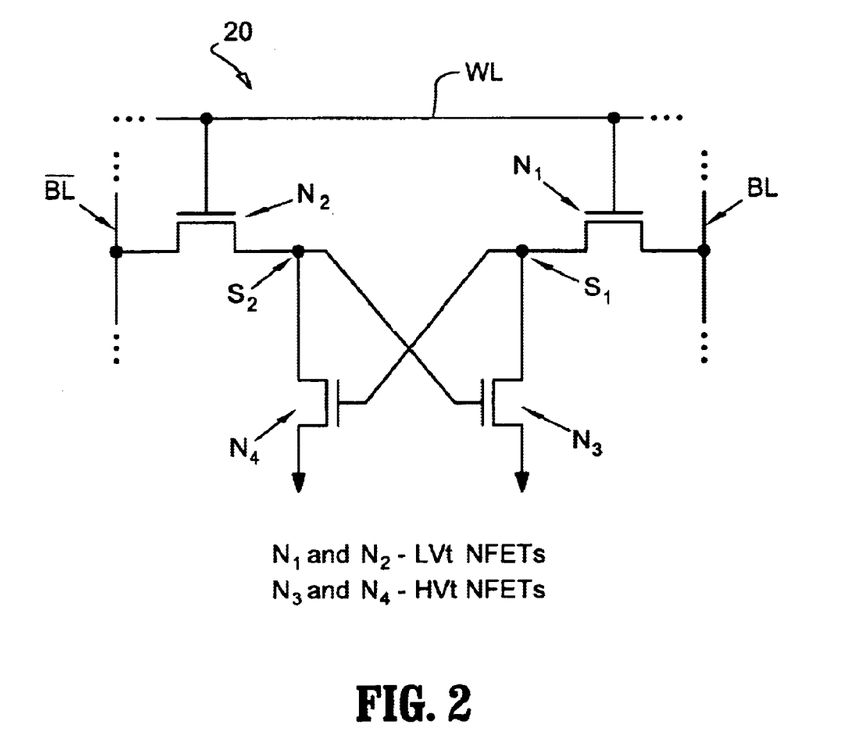
FIG. 2 is a schematic diagram illustrating a loadless four-transistor SRAM memory cell according to an embodiment of the present invention.

FIG. 2 is a diagram that schematically illustrates a loadless 4T SRAM memory cell according to an embodiment of the present invention. In the exemplary embodiment of FIG. 2, a loadless 4T SRAM memory cell (20) comprises two NFET (or NMOSFET) access transistors (N1, N2) and two NFET (or NMOSFET) pull-down transistors (N3, N4). A common word line (WL) is coupled to the gates of the access transistors (N1) and (N2). A bit line pair (BL, /BL) is connected to the memory cell (20), wherein the bitline (BL) is connected to a drain terminal of the access transistor (N1) and wherein the complementary bit line (/BL) is connected to a drain terminal of the access transistor (N2). The memory cell (20) comprises two storage nodes (S1) and (S2) (or I/O ports), wherein a source terminal of access transistor (N1) is connected to storage node (S1) and a source terminal of access transistor (N2) is connected to storage node (S2). The storage node (S1) is cross-coupled to a gate terminal of pull-down transistor (N4) and the storage node (S2) is cross-coupled to a gate terminal of pull-down transistor (N3). The source of access transistor (N1) is coupled to a drain of the pull-down transistor (N3) and a source of pull-down transistor (N3) is coupled to ground (or Vss). The source of the access transistor (N2) is coupled to a drain of the pull-down transistor (N4) and a source of the pull-down transistor (N4) is coupled to ground (Vss).

In accordance with an exemplary embodiment of the invention, the transistors of cell (20) are designed such that the threshold voltages of the pull-down transistors (N3) and (N4) are greater than the threshold voltages of the access transistors (N1) and (N2). In other words, for purposes of discussion, the access transistors (N1) and (N2) can be referred to as LVt (low threshold voltage) transistors and the pull-down transistors (N3) and (N4) can be referred to as HVt (high threshold voltage) transistors. Since, a greater voltage threshold voltage renders an NFET (or NMOSFET) less leaky (higher channel resistance), the "OFF" resistance of the pull-down transistors (N3) and (N4) are greater than the "OFF" resistance of the access transistors (N1) and (N2), which enables the semiconductor memory cell (20) to maintain a logic "1" during standby mode.

Figure 3:
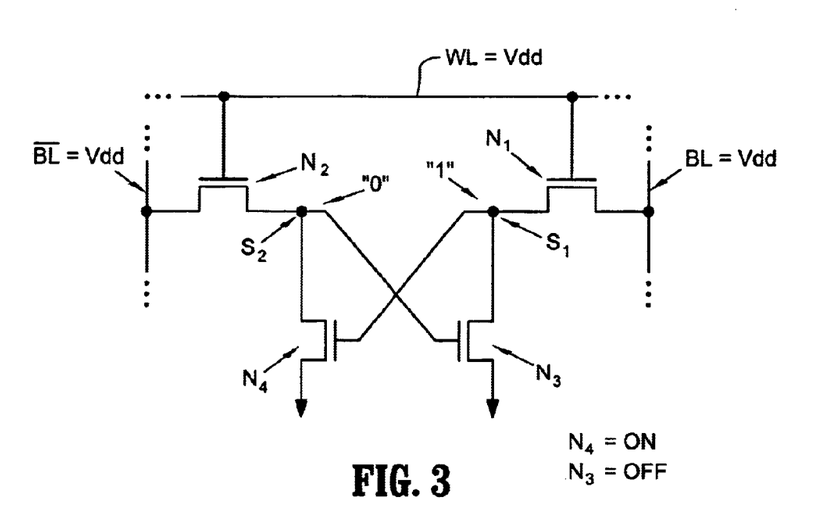
FIG. 3 is a schematic diagram illustrating a loadless four-transistor SRAM memory cell as shown in FIG. 2 having an exemplary logic state.

By way of example, referring to the illustrative embodiment of FIG. 3, assume the bit line (BL) is maintained (precharged) to Vdd during standby and that the storage node (S1) is logic "1". In such case, the access transistor (N1) and pull-down transistor (N3) act as a voltage divider between the precharged bit line (BL) and ground to maintain logic "1" at storage node (S1), wherein the voltage divider is determined by the "OFF" resistance of the access transistor (N1) and the "OFF" resistance of the pull-down transistor (N3). In one exemplary embodiment, the "OFF" resistance of the pull-down transistor (N3) is designed to be higher than the "OFF" resistance of the access transistor (N1) such that the voltage drop across the pull-down transistor (N3) is almost equal to the precharged voltage potential, Vdd, on the bit line (BL).

Likewise, during standby, assuming storage node (S2) is logic "1", the access transistor (N2) and pull-down transistor (N4) act as a voltage divider between the precharged complementary bit line (/BL) and ground to maintain logic "1" a storage node (S2).

In one exemplary embodiment, the leakage of the LVt access transistors are about an order of magnitude higher that the leakage of the HVt pull-down transistors. In other words, the "OFF" resistance of the pull-down transistors (N3) and (N4) is about 10 times greater that the "OFF" resistance of the access transistors (N1) and (N2). To obtain such resistance disparity, the threshold voltages of the HVt pull-down transistors (N3, N4) are about 80–90 mv greater than the threshold voltages of the LVt access transistors (N1, N2). Accordingly, when the "OFF" resistance of the pull-down transistors (N3, N4) are about 10× greater than that of the access transistors, the voltage of the storage nodes (S1, S2) drop only as much as 10% of Vdd, i.e., a logic "1" stored at node (S1) or (S2) is about 0.9 Vdd.

Furthermore, in another exemplary embodiment of the present invention, the HVt pull-down transistors (N3) and (N4) are designed such that the cell (20) can readily maintain a logic "0" during a read operation to avoid the cell (20) from changing states. More specifically, in one exemplary embodiment, the SRAM cell (20) can hold a logic "0" by making the channel widths of the pull-down transistors (N3) and (N4) to be about 3 to about 4 times greater than the channel widths of the access transistors (N1) and (N2). As is known in the art, the switching speed of an FET is proportional to the ratio of channel width to channel length, i.e., W/L, wherein the switching speed increases as W increases and/or L decreases. In effect, the larger width pull-down devices help maintain logic "0".

For example, referring again to the illustrative embodiment of FIG. 3, wherein it is assumed that the potential of storage node (S2) is at logic "0" and the potential of storage node (S1) is at logic "1". In this case, the pull-down transistor (N4) would be turned ON and the pull-down transistor (N3) would be turned OFF. Further, during standby, the access transistors (N2) and (N1) would be turned off. During standby of the cell (20), the pull-down transistor (N4) would be able to readily discharge any charge build up on storage node (S2) due to leakage of the access transistor (N2) (when the bit lines are precharged to Vdd) to maintain the logic level of "0" for storage node (S2).

Furthermore, during a read operation wherein the bit line (BL) and complementary bit line (/BL) are precharged to Vdd and the wordline is activated at Vdd, even with the access transistor (N2) activated (via WL signal of Vdd), the pull-down transistor (N4) would have a lower "ON" resistance as compared to the "ON" resistance of the access transistor (N2), due to the greater W/L ratio of the pull-down transistor (N4) as compared to the W/L ratio of the access transistor (N2), notwithstanding that the Vt of pull-down transistor (N4) is greater than that of the access transistor (N2). Accordingly, by making the channel width of a pull-down transistors (N3, N4) wide enough, the pull-down transistors (N3, N4) can hold the logic level of a storage node (S1) or (S2) "0" low during a read operation when the wordline (WL) is activated, thereby avoiding the cell (20) changing states.

Furthermore, in the above example, the logic state of node (S1) is readily maintained as logic "1" during standby and read because the pull-down transistor (N3) is turned off due to its gate being driven by the logic "0" maintained at node (S2). Furthermore during read, the higher "OFF" resistance of the pull-down transistor (N3), due to the higher threshold voltage, maintains the logic "1" of storage node (S1).

It is to be appreciated that based on the teachings herein, one of ordinary skill in the art can readily adjust the sizes and threshold voltages of the access and pull-down transistors in a loadless 4T SRAM cell according to an embodiment of the invention, to thereby achieve a desired trade off between size, stability and switching speed.

In another exemplary embodiment of the present invention, increased performance of an SRAM semiconductor memory device comprising an array of loadless 4T SRAM cells according to an embodiment of the invention, is obtained by dynamically adjusting the threshold voltages of transistors of memory cells that are activated during a memory access operation to thereby increase the read current, $I_{Read}$, of the accessed memory cells. In particular, in one embodiment of the invention, dynamic threshold voltage adjustment is obtained by applying a forward body bias (FBB) to decrease the threshold voltage of the transistors of the accessed memory cells to increase the read current with respect to, e.g., the storage nodes that store logic "0". Details of using a FBB to decrease the threshold voltage and increase the read current will now be provided with reference to FIGS. 4–6, for example.

Figure 4:
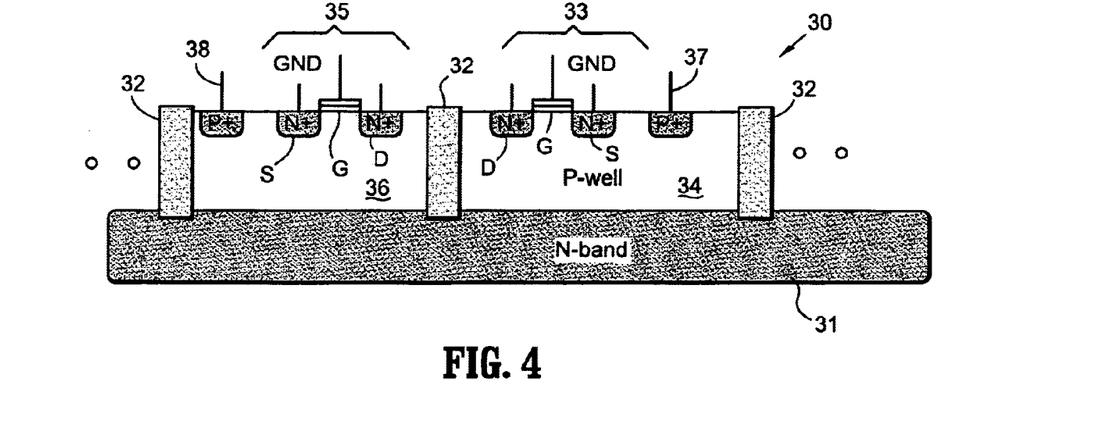
FIG. 4 is a cross-sectional view of a section of a semiconductor memory device comprising loadless 4T SRAM cells, according to an embodiment of the present invention.

FIG. 4 is a cross-sectional view of a section of a semiconductor memory device comprising an array of loadless 4T SRAM cells according to an embodiment of the present invention. The semiconductor memory device (30) comprises a SOI (silicon on insulator) substrate comprising a lightly N doped insulating portion (31) (e.g., an N− silicon substrate) and a plurality of lightly P doped silicon device wells (34) and (36) (referred to as P− wells) that are separated by device isolation regions (32). In accordance with an embodiment of present invention, each SRAM cell comprises a separate P− well, and the P− wells of all SRAM cells in a given row are commonly connected.

Figure 5:
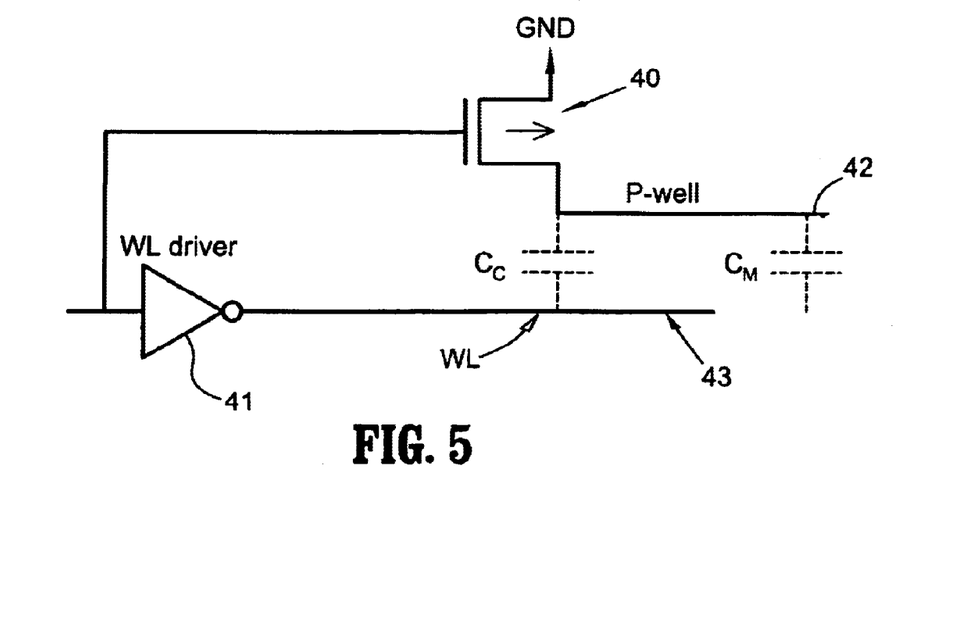
FIG. 5 is a diagram illustrating a circuit and method for dynamically adjusting the threshold voltages of transistors of selected memory cells according to an embodiment of the present invention.

The exemplary embodiment of FIG. 4 depicts a cross-section of two rows of SRAM cells for illustrative purposes, although it is to be understood that the semiconductor memory device (30) comprises more than two rows of cells. As shown, one row comprises an NMOS transistor (35) of one cell, and another row comprises an NMOS transistor (33) of another cell. Each NMOS transistor comprises N+ diffusion regions, which are the drains D and sources S of the transistors (33, 35), and stacked gate structures G. Each P− well (34, 36) comprises a P+ diffusion region (37, 38), which acts as a contact to the respective P− well (34, 36). All P+ contacts of P− wells in a given row of the memory array are commonly connected to a common P− well line (42), which, as shown in FIG. 5, is connected to a NFET transistor (40). It is to be understood that in other embodiments wherein the semiconductor memory device is made using bulk techniques, the memory cells of a given row may share a common P− well, in which case commonly connected P+ diffusion regions are formed at various positions in the commonly shared P− well.

In operation, when a given row of memory cells is selected via a corresponding wordline, the commonly connected P− wells of the memory cells in the selected row are bootstrapped to a higher voltage to forward bias the transistors of such cells to improve the cell read current. Typically, with page mode operation, or cache operation, the memory array is designed such that an entire row of memory cells is read or written to, when the row is selected by the corresponding wordline. In such case, the P− wells of the transistors in the selected row of memory cells are all bootstrapped to a higher voltage to dynamically decrease the Vts of the memory cell transistors to thereby obtain increased performance for data access, e.g. reading data from the selected cells at a much faster rate.

FIG. 5 is a diagram illustrating a circuit for dynamically adjusting the threshold voltages of transistors of selected memory cells according to an embodiment of the present invention. More specifically, FIG. 5 illustrates a bootstrapping circuit for bootstrapping the commonly connected P− wells of memory cells of a selected row upon activation of the WL corresponding to the selected row to thereby forward bias the cell transistors. The circuit depicted in FIG. 5 comprises an NFET (40) and a wordline driver (41). A gate terminal of the NFET (40) is connected to the input terminal of the wordline driver (41). A source terminal of the NFET (40) is connected to ground (or Vss) and the drain terminal of the NFET (40) is connected to a common P− well line (42) that is commonly connected to the P− well contacts (e.g., P+ diffusion regions) of all memory cells in a given row in the SRAM array. Moreover, the output of the wordline driver (41) is connected to a wordline (WL), which is commonly connected to the gates of all access transistors of the SRAM cells of the corresponding row. It is to be understood that there is one bootstrapping circuit for each row of memory cells in an SRAM array.

The circuit of FIG. 5 operates as follows. During standby, when a given row is not selected, the input to the wordline driver (41) and NFET (40) will be maintained at logic level "1". As such, during standby, the NFET (40) is activated which essentially connects the common P− well line (42) to ground, thus pulling the P− wells of all cells in the given row to ground potential. Further, the WL signal output from the driver (41) to the wordline (WL) will be logic "0", thus maintaining the access transistors in an Off state.

On the other hand, when the wordline (WL) for the given row is activated (i.e., the input to the driver (41) transitions from logic "1" to logic "0"), the output of the driver (41) transitions from logic "0" to logic "1" and the NFET (40) is deactivated. In such circumstance, the common P− well line (42) is essentially disconnected from ground potential and the transition of logic state of the WL causes charge to be bootstrapped to the common P− well line (42).

Figure 6A:
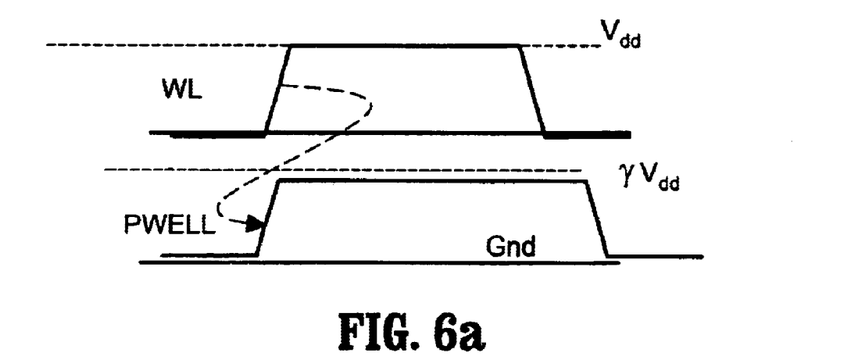
FIGS. 6a and 6b are illustrate a method for dynamically adjusting the threshold voltages of transistors of selected memory cells according to an embodiment of the invention.
Figure 6B:
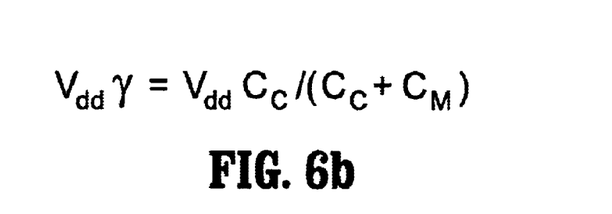

More specifically, as shown in FIGS. 6a and 6b, when the row of cells is selected, the P− wells of the memory cells in the selected row are bootstrapped to a higher voltage, $V_{dd}\gamma$, wherein $\gamma = C_C/(C_C+C_M)$ (the ratio of the coupling capacitance, $C_C$, to the total capacitance, $C_C+C_M$). The coupling capacitance, $C_C$, represents the capacitance between the wordline (43) and the common P− well line (42) and the capacitance, $C_M$, represents the total P− well capacitance to ground, which is equal to the sum of the N+/P− junction capacitance of each cell along the row and the P− well to N− band capacitance.

Since the commonly connected P− wells of the memory cells in the selected row are bootstrapped with charge from the activated WL, the P− well voltage of the memory cells of the selected row will rise above ground potential, which essentially forward biases the source junctions of all transistors in the memory cells of the selected row. The forward body bias that is applied during access (via the bootstrap on the P− well by the WL activation) results in decreasing the threshold voltage of the transistors of the selected memory cells, to thereby enable a high read current $I_{Read}$. In other words, the forward body bias on the source junctions causes the transistor threshold voltage to decrease, which effectively increases the cell read current that flows, for example, from the bit line to the cell storage node that stores a logic "0". The decrease in Vt enables the selected device to conduct read current more easily, which directly impacts the performance of the SRAM.

Advantageously, a method for dynamically adjusting the threshold voltages according to an embodiment of the invention provides a low power and low performance overhead application. Indeed, isolation of each row of P− wells enables bootstrapping to be applied for only a selected row, which limits power consumption resulting from the bootstrapping. Furthermore, power consumption and performance overhead is limited in the sense that the capacitance that is being driven for purposes of bootstrapping is merely the depletion capacitance between the lightly doped P− wells and N− band, and the P− well and N+ ground junction along the row of cells.

In summary, loadless 4T SRAM cells, and methods for operating such SRAM cells according to embodiments of the present invention provide various features that enable high performance and low power consumption. Indeed, the difference in threshold voltage between access and pull-down transistors enables an SRAM cell to prevent leakage and readily maintain a logic "1" during standby at a sufficiently high voltage. Further, an increase in the channel width of the pull-down transistors enables the SRAM cell to maintain logic "0" during a read operation. Furthermore, the isolation of device wells for all memory cells of a given row in an SRAM array enables the Vts of devices in a selected row of memory to be adjusted to provide an increase in read current of the selected cells, lower the Vt variablity of cell transistors, and otherwise increase the performance of such SRAM cells. In addition, the implementation of NFETs (such as NMOSFETS) for all transistors in a loadless, 4T SRAM cell enables high density memory devices.

It is to be understood that loadless 4T SRAM cells according to embodiments of the invention as described herein, can be implemented in any memory system architecture. For instance, a memory system in which the invention may be implemented comprises a memory array having an array of loadless 4T SRAM memory cells formed on a semiconductor substrate and arranged in rows and columns, wherein a row of memory cells is commonly connected to a wordline and wherein a column of memory cells is commonly connected to a bit line pair. The memory system further comprises a controller (e.g., CPU, memory controller, etc.) for generating address and command signals for performing memory access operations. Further, the memory system includes decoding circuity (e.g., wordline address and column address decoders, etc.) for decoding the address and command signals received from the controller as well as circuity (e.g., sense amplifiers, wordline drivers, etc.) for accessing data of the memory cells in the memory array, as well as bootstrapping circuitry (as depicted in FIG. 6, for example).

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A bistable memory cell, comprising:
   a first and second data terminal;
   a first and second storage node;
   an activation terminal;
   a first access transistor connected between the first data terminal and the first storage node, wherein a gate terminal of the first access transistor is connected to the activation terminal;
   a second access transistor connected between the second data terminal and the second storage node, wherein a gate terminal of the second access transistor is connected to the activation terminal;
   a first pull-down transistor, connected between the first storage node and ground, wherein a gate terminal of the first pull-down transistor is connected to the second storage node; and
   a second pull-down transistor, connected between the second storage node and ground, wherein a gate terminal of the second pull-down transistor is connected to the first storage node;
   wherein the first and second access transistor have a first threshold voltages that are substantially the same, and wherein the first and second pull-down transistors have second threshold voltages that are substantially the same, wherein the second threshold voltages are greater than the first threshold voltages.

2. The memory cell of claim 1, wherein the first and second access and pull-down transistors are all NFETs (N-channel field effect transistors).

3. The memory cell of claim 1, wherein the first and second access and pull-down transistors are all NMOSFETs (N-channel metal oxide semiconductor field effect transistors).

4. The memory cell of claim 1, wherein the second threshold voltages are about 80 to about 90 mv greater than the first threshold voltages.

5. The memory cell of claim 1, wherein the first and second access transistors have first channel widths that are substantially the same, and wherein the first and second pull-down transistors have second channel widths that are substantially the same, wherein the second channel widths are greater than the first channel widths.

6. The memory cell of claim 5, wherein the second channel widths are at least about 3 times greater than the first channel widths.

7. The memory cell of claim 1, wherein the memory cell is a loadless, 4T (4-transistor) SRAM (static random access memory) cell.

8. The memory cell of claim 1, wherein the first and second access transistors and pull-down transistors have devices wells that are commonly connected or shared, wherein the device wells are connected to a common device well line, wherein the device well line is connected to ground potential during standby and wherein the common device well line is bootstrapped to a higher voltage than ground potential during an access operation of the cell to decrease the voltage thresholds of the first and second access and pull-down transistors.

9. The memory cell of claim 8, wherein the device well line is connected to a switch that disconnects the device well line from ground when cell is activated.

10. The memory cell of claim 9, wherein the switch comprises a FET that is responsive to a wordline driver control signal.

11. A loadless 4-transistor SRAM (static random access memory) cell, comprising:
    a first and second bit line terminal;
    a first and second storage node;
    a wordline;
    a first NFET access transistor connected between the first bit line terminal and the first storage node, wherein a gate terminal of the first access transistor is connected to the wordline;
    a second NFET access transistor connected between the second bit line terminal and the second storage node, wherein a gate terminal of the second access transistor is connected to the wordline;
    a first NFET pull-down transistor, connected between the first storage node and ground, wherein a gate terminal of the first pull-down transistor is connected to the second storage node; and
    a second NFET pull-down transistor, connected between the second storage node and ground, wherein a gate terminal of the second pull-down transistor is connected to the first storage node;
    wherein the first and second NFET access transistors have a first threshold voltages that are substantially the same, and wherein the first and second NFET pull-down transistors have second threshold voltages that are substantially the same, wherein the second threshold voltages are greater than the first threshold voltages.

12. The memory cell of claim 11, wherein the first and second NFET access and pull-down transistors are all NMOSFETs (N-channel metal oxide semiconductor field effect transistors).

13. The memory cell of claim 11, wherein the second threshold voltages are about 80 to about 90 mv greater than the first threshold voltages.

14. The memory cell of claim 11, wherein the first and second access transistors have first channel widths that are substantially the same, and wherein the first and second pull-down transistors have second channel widths that are substantially the same, wherein the second channel widths are greater than the first channel widths.

15. The memory cell of claim 14, wherein the second channel widths are at least about 3 times greater than the first channel widths.

16. The memory cell of claim 11, wherein the first and second access transistors and pull-down transistors have devices wells that are commonly connected or shared, wherein the device wells are connected to a common device well line, wherein the device well line is connected to ground potential during standby and wherein the common device well line is bootstrapped to a higher voltage than ground potential during an access operation of the cell to decrease the voltage thresholds of the first and second access and pull-down transistors.

17. The memory cell of claim 16, wherein the device well line is connected to a switch that disconnects the device well line from ground when cell is activated.

18. The memory cell of claim 17, wherein the switch comprises a FET that is responsive to a wordline driver control signal.

19. The memory cell of claim 16, wherein the common device well line is bootstrapped with charge from an activated wordline.

20. A memory system, comprising:
a memory array comprising an array of memory cells formed on a semiconductor substrate arranged in rows and columns, wherein a row of memory cells is commonly connected to a wordline and wherein a column of memory cells is commonly connected to a bit line pair;
a controller for generating address and command signals; and
decoding circuity for decoding the address and command signals to access memory cells in the memory array,
wherein each memory cell in the memory array comprises a loadless 4-transistor SRAM (static random access memory) cell comprising:
a first and second bit line terminal;
a first and second storage node;
a wordline terminal;
a first NFET access transistor connected between the first bit line terminal and the first storage node, wherein a gate terminal of the first access transistor is connected to the wordline terminal;
a second NFET access transistor connected between the second bit line terminal and the second storage node, wherein a gate terminal of the second access transistor is connected to the wordline terminal;
a first NFET pull-down transistor, connected between the first storage node and ground, wherein a gate terminal of the first pull-down transistor is connected to the second storage node; and
a second NFET pull-down transistor, connected between the second storage node and ground, wherein a gate terminal of the second pull-down transistor is connected to the first storage node;
wherein the first and second NFET access transistors have a first threshold voltages that are substantially the same, and wherein the first and second NFET pull-down transistors have second threshold voltages that are substantially the same, wherein the second threshold voltages are greater than the first threshold voltages.

21. The memory system of claim 20, wherein the first and second NFET access and pull-down transistors are NMOS-FETs (N-channel metal oxide semiconductor field effect transistors).

22. The memory system of claim 20, wherein the first and second access transistors have first channel widths that are substantially the same, and wherein the first and second pull-down transistors have second channel widths that are substantially the same, wherein the second channel widths are greater than the first channel widths.

23. The memory system of claim 22, wherein the second channel widths are at least about 3 times greater than the first channel widths.

24. The memory system of claim 20, wherein each memory cell comprises a device well, and wherein for each row in the memory array, the device wells of memory cells in the row are commonly connected or shared and connected to a common device well line.

25. The memory system of claim 24, wherein the device well line is connected to ground potential during standby and wherein the common device well line is bootstrapped to a higher voltage than ground potential by charge on an activated wordline to decrease the voltage thresholds of the transistors of the memory cells in the corresponding row.

26. The memory cell of claim 25, wherein the common device well line for each row is connected to a corresponding switch that disconnects the device well line from ground when row is activated.

27. The memory system of claim 26, wherein the switch comprises a FET that is responsive to a wordline driver control signal.

28. The memory system of claim 24, wherein the memory array comprises a plurality of isolation regions for isolating the device wells of memory cells of adjacent rows in the array.

29. A method for accessing memory, comprising the steps of:
selecting a row of memory cells in a memory array by activating a wordline corresponding to the row of memory cells;
bootstrapping charge on the activated wordline to a common device well line that is commonly connected to device wells of memory cells in the selected row to reduce a threshold voltage of transistors of the memory cells in the selected row; and
performing a data access operation for at least one memory cell in the selected row.

30. The method of claim 29, wherein the step of bootstrapping comprises:
disconnecting the common device well line from a logic "0" potential; and
capacitively coupling charge to the common device well line from the activated wordline.

31. The method of claim 30, wherein the step of disconnecting the common device well line from logic "0" potential comprises activating a switch in response to a wordline driver signal.

* * * * *